United States Patent [19]

Sakamoto

[11] Patent Number: 5,583,605
[45] Date of Patent: Dec. 10, 1996

[54] PHOTOELECTRIC CURRENT CONVERTING CIRCUIT

[75] Inventor: Hiroshi Sakamoto, Kawaskai, Japan

[73] Assignee: Nikon Corporation, Tokyo, Japan

[21] Appl. No.: 234,944

[22] Filed: Apr. 28, 1994

[30] Foreign Application Priority Data

Apr. 27, 1993 [JP] Japan .................................. 5-101197

[51] Int. Cl.$^6$ .............................. G03B 15/05; H03K 5/00
[52] U.S. Cl. ............................................ 396/159; 327/101
[58] Field of Search ................................... 354/416, 417,
354/429, 432, 433; 307/108; 327/101, 176,
291; 331/66; 341/157

[56] References Cited

U.S. PATENT DOCUMENTS

| | | | |
|---|---|---|---|
| 3,419,784 | 12/1968 | Winn | 327/101 |
| 3,846,806 | 11/1974 | Yata et al. | 354/416 |
| 4,023,188 | 5/1977 | Ueda et al. | 354/416 |
| 4,035,814 | 7/1977 | Nobusawa | 354/416 |
| 4,249,109 | 2/1981 | Ogawa | 354/416 |
| 4,297,011 | 10/1981 | Adams, Jr. | 354/416 |
| 4,410,812 | 10/1983 | Honig et al. | 327/101 |
| 4,695,742 | 9/1987 | Randall | 327/101 |

*Primary Examiner*—W. B. Perkey
*Attorney, Agent, or Firm*—Oliff & Berridge

[57] ABSTRACT

A light adjusting circuit for a flash lamp of a camera includes a current converting circuit for converting the current output from a photodetector into a voltage modulated signal suitable for a counter circuit. The current converting circuit uses a capacitor to convert the current output by the photodiode into a voltage. The capacitor voltage is compared to a base or reference voltage. The output of the comparator is used to mask a clock signal output from a high frequency oscillator. When the clock signal is unmasked, the pulse output from the current converting circuit is counted by the counter circuit to turn the flash lamp on and off. The output from the comparator is also used to controllably discharge the capacitor when the capacitor voltage exceeds the reference voltage.

21 Claims, 11 Drawing Sheets

PHOTOELECTRIC CURRENT CONVERTING CIRCUIT

BACKGROUND OF THE INVENTION

1. Field of the Invention

This invention is directed to a control circuit for an automatic light adjusting circuit for an electronic flash device. More particularly, this invention is directed to a control circuit for detecting and controlling the light output from a flash lamp or the like. Specifically, this invention is directed to a current converting circuit for converting a current value of a signal from a photodetector into a logic-level voltage pulse train signal.

2. Description of Related Art

Heretofore, photometric circuits, provided with an electronic flash device and automatically adjusting the light output of the flash device, charged an integral capacitor, either directly through the photoelectric current of the light receiving element or indirectly through an amplifier. The known photometric circuits then compare the voltage level of the charged capacitor with a base value corresponding to the correct amount of light, using an analog comparator. These known photometric circuits are structured to automatically adjust the light output by turning off the light-emitting element once the correct amount of light has been generated.

In these known photometric circuits, a large percentage of the circuitry is formed by analog circuits, including a light-receiving amplifier, a photoelectric current integrated circuit, a comparator and the base voltage supply circuit. For this reason, interfacing was difficult when controlling the analog photometric circuit with digital circuits such as microcomputers. In these known photometric circuits, the gain of the amplifier and the base voltage are generated using a microcomputer D/A converter, but controlling the majority of the automatic light adjusting circuit's components requires analog circuits. Therefore, the scale of analog circuitry cannot be reduced, in comparison with the size of electronic flash devices before microcomputers were built into cameras. Quite to the contrary, by installing a microcomputer, the circuitry of the known electronic flash device becomes more complex and leads to a larger device and increased production costs.

It is no longer possible to design a camera without microcomputers because of the trend toward high performance products that include features such as electronic flash devices. Therefore, this invention aims to reduce the overall scale of circuitry by replacing the known analog circuitry with digital circuitry using microcomputers.

In order to process the photometric integral value with digital circuits such as a microcomputer, one first must convert the analog signals to digital signals. However, A/D circuits have a significant output delay compared to devices having a quick response time, such as the flash lamp of the electronic flash device. There are instances when the flash time necessary to output a small amount of light is below 50 microseconds. Under present conditions, a sequential comparative-type 8-bit A/D converter with an installed microcomputer is a speedy component, even including the setting and reading processing time. Even so, the A/D conversion using the fast converter takes around 20 microseconds. In this case, even if the light adjusting circuit determines the correct amount of light that has been output, because the A/D conversion cycle is incomplete relative to the flash time, a time lag occurs between the correct termination time and the time when the microcomputer turns off the flash lamp. Because of this, the light adjustment characteristic during low light output amount events is extremely poor. The conversion time can be shortened by using a flash A/D converter. However, the microcomputer is constantly comparing the A/D conversion results with the base values and must determine whether or not to turn off the flash lamp. During this period the microcomputer is completely unable to perform other operations. Therefore, conventional A/D conversion methods are unsuitable and a new method is necessary.

One new method creates a number of logic level voltage pulses in proportion to the photoelectric current from the light-receiving element and detects the amount of light output by the flash lamp by counting the pulses.

SUMMARY OF THE INVENTION

This invention provides an improved digital automatic light adjusting circuit for adjusting the light output by a light emitting element of a camera.

This invention also provides an improved digital automatic light adjusting circuit having a capacitor connected in series with a light receiving element to convert a current flow from the light receiving element to a voltage stored in the capacitor, a comparator comparing the capacitor's stored voltage with a reference voltage and outputting a predetermined voltage level depending on the comparison, a logic circuit including a clock to convert the voltage level of the comparator to a voltage pulse train, and at least one discharge loop for discharging the charged capacitor.

The invention additionally provides an improved digital automatic light adjusting circuit having a series of switching elements and resistances forming electrical discharge loops to control the voltage across or charge stored in the capacitor.

This invention further provides for multiple series of switching elements and resistances in the improved digital automatic light adjusting circuit to form multiple discharge loops for discharging the capacitor.

This invention also provides an improved digital automatic light adjusting circuit where current converting circuit switches between the multiple discharge loops at intervals of less than one clock cycle.

This invention further provides an improved digital automatic light circuit having a selector for selecting different ones of the multiple discharge loops.

This invention finally provides an improved digital automatic light adjusting circuit having multiple base electric sources connectable to the light receiving element and the capacitor.

Figure 2:
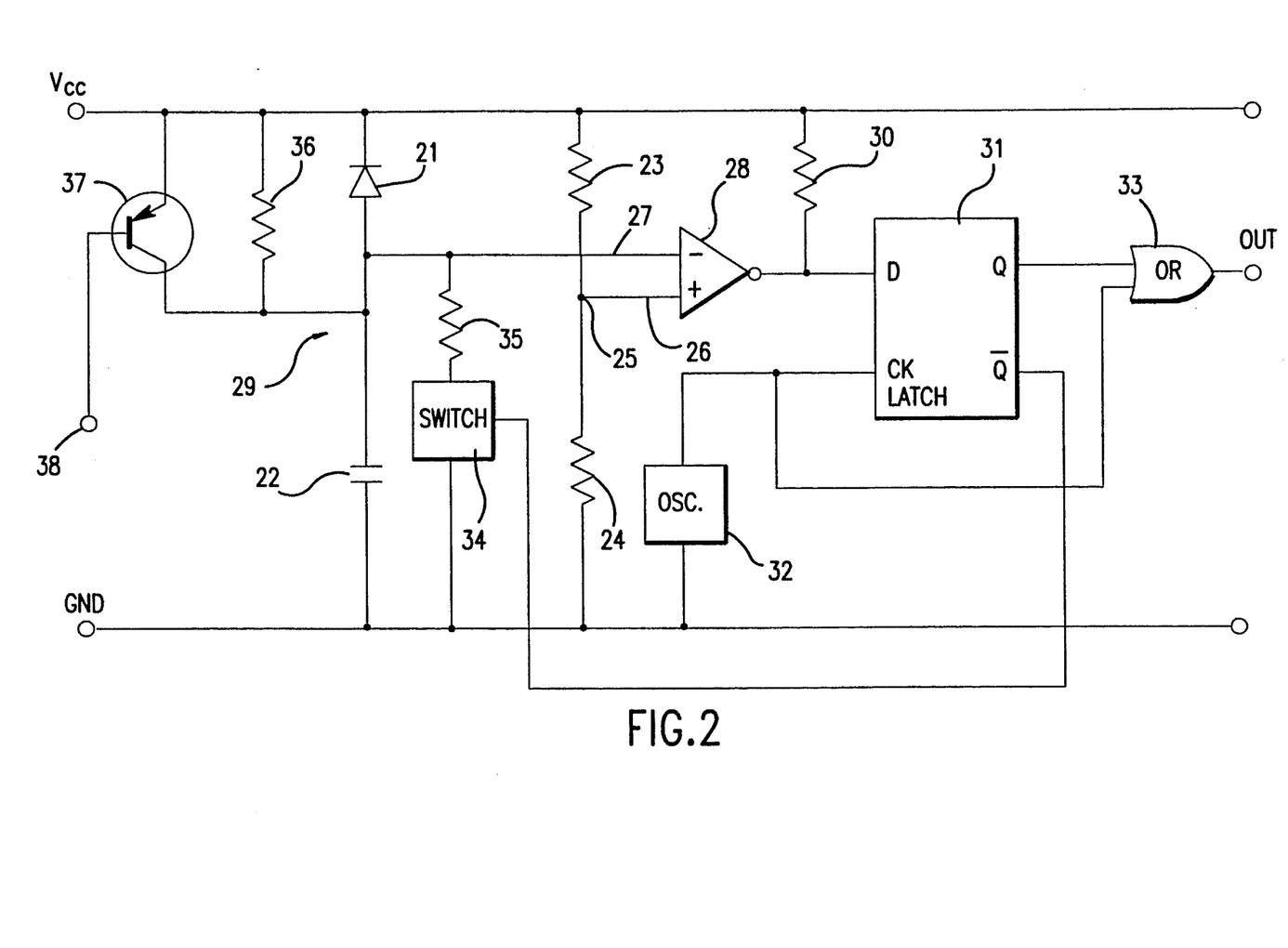
FIG. 2 is a schematic diagram of the first preferred embodiment of the photoelectric current converting circuit.

In a first preferred embodiment of the invention, as shown in FIG. 2, the digital automatic light adjusting circuit includes a photodiode connected in series with a capacitor between a base voltage source and ground (earth), a comparator connected between the resistors of a voltage divider and between the photodiode and the capacitor, a latch having its input connected to the output of the comparator, a clock circuit, and a gate circuit, the inputs of the gate connected to the clock circuit and the positive output of the latch circuit. A discharge loop comprising a switch element and a resistor is connected in parallel with the capacitor and is controlled by the negative output of the latch circuit.

Figure 4:
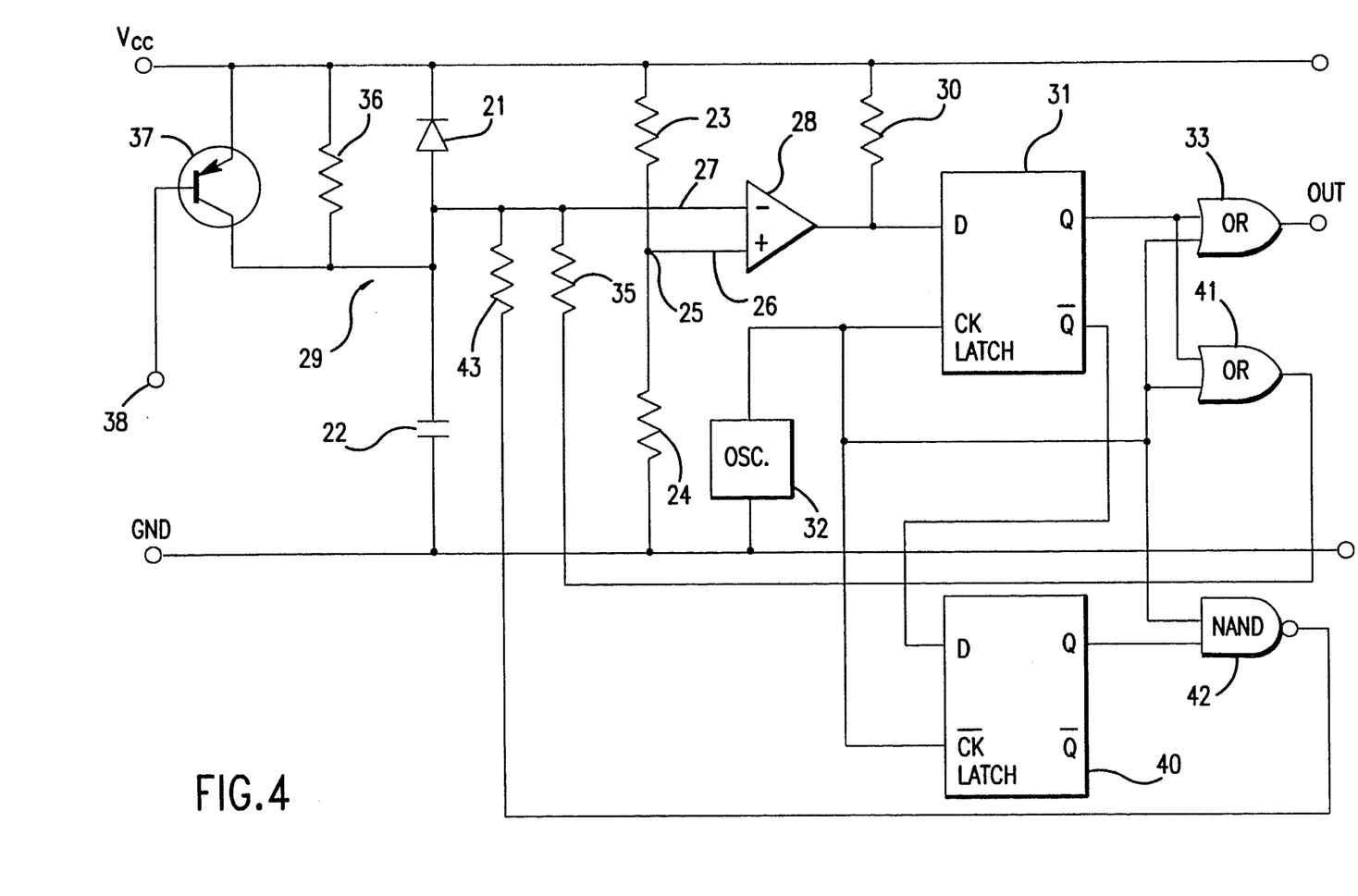
FIG. 4 is a schematic diagram of the second preferred embodiment of the photoelectric current converting circuit.

In a second preferred embodiment, as shown in FIG. 4 (and FIG. 12), multiple discharge loops are provided to discharge the capacitor, the multiple discharge loop designed to be active at different times and for less than one cycle of the clock.

Figure 6:
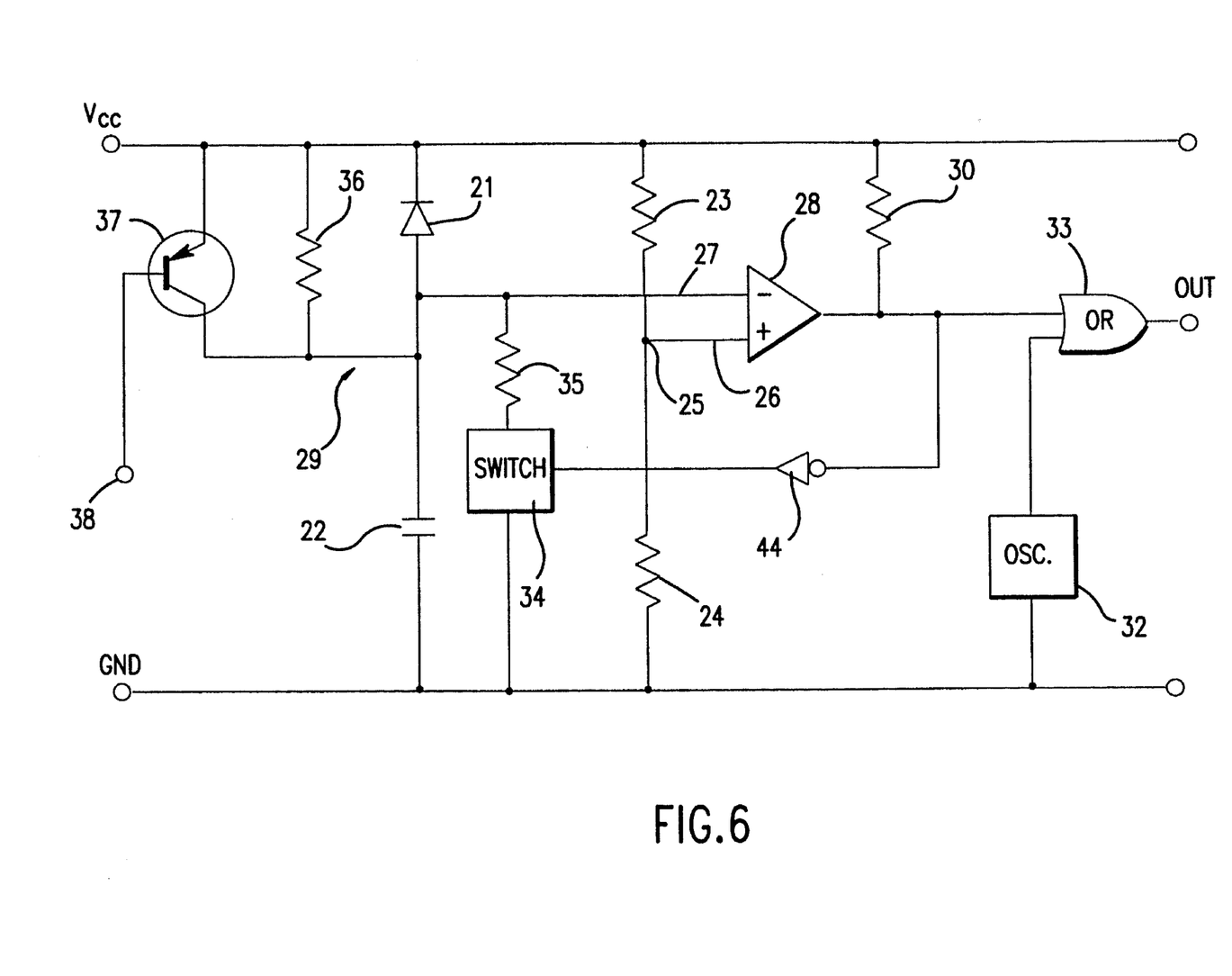
FIG. 6 is a schematic diagram of the third preferred embodiment of the photoelectric current converting circuit.
Figure 10:
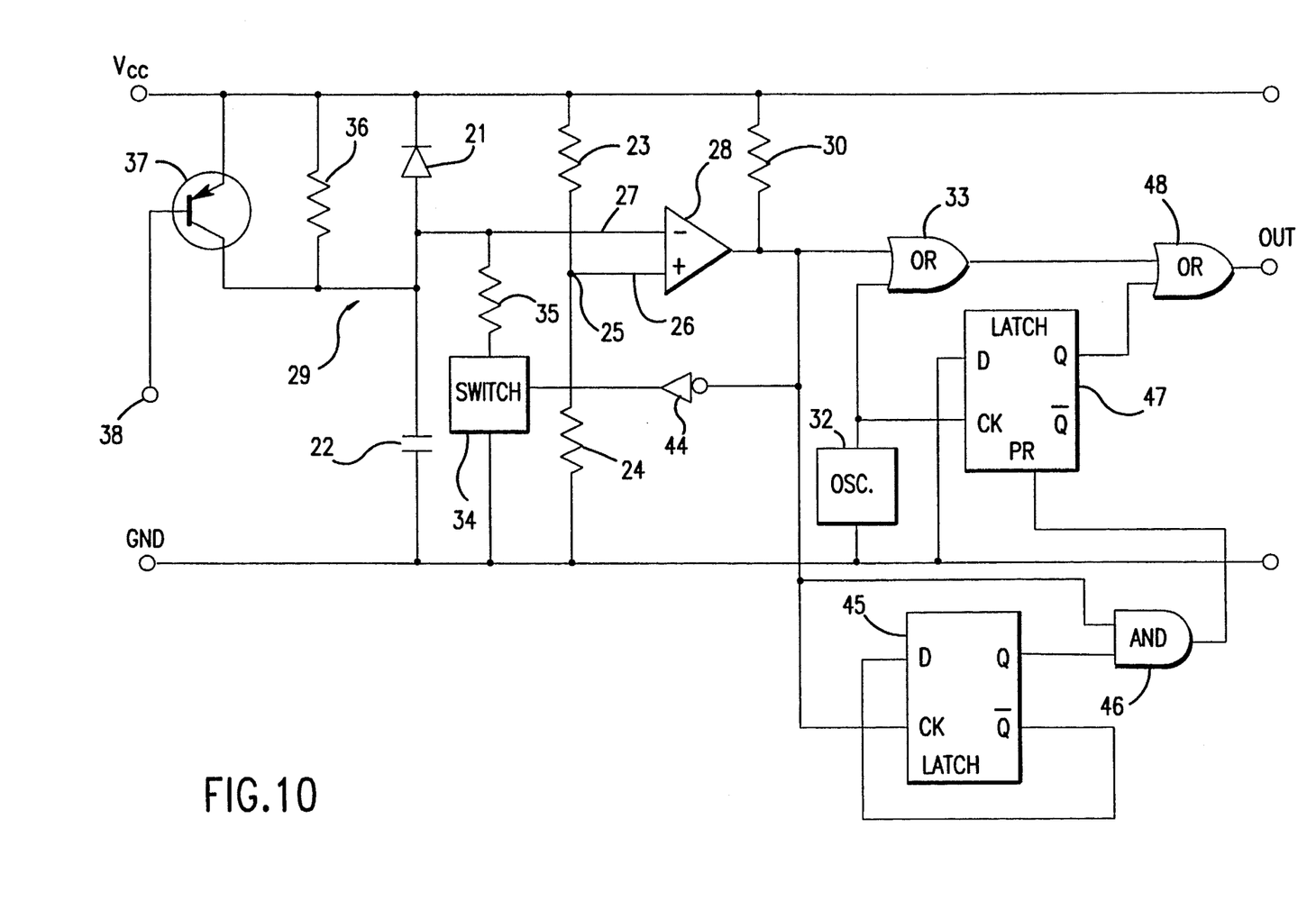
FIG. 10 is a schematic diagram of a variation of the third preferred embodiment of the photoelectric current converting circuit.

In a third preferred embodiment, as shown in FIGS. 6 and 10, the switch element of the first preferred embodiment is controlled by the output of the comparator, rather than by the output of the latch circuit, which is eliminated in FIG. 6.

Figure 12:
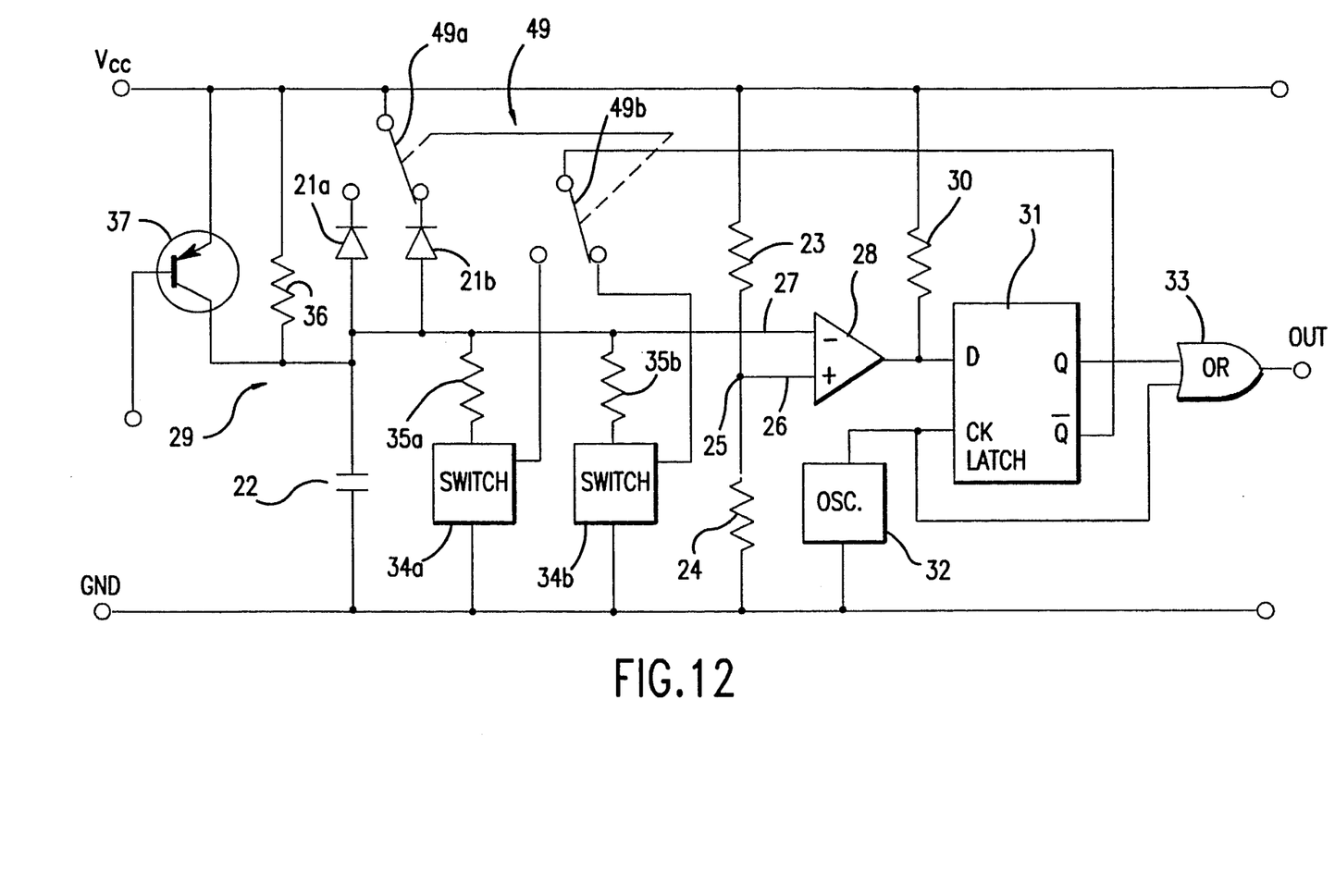
FIG. 12 is a schematic diagram of the fourth preferred embodiment of the photoelectric current converting circuit.

In a fourth preferred embodiment, as shown in FIG. 12, a number of photodiodes (and discharge loops) are provided, with the negative output of the latch circuit selecting the particular photodiode and discharge loop.

Figure 13:
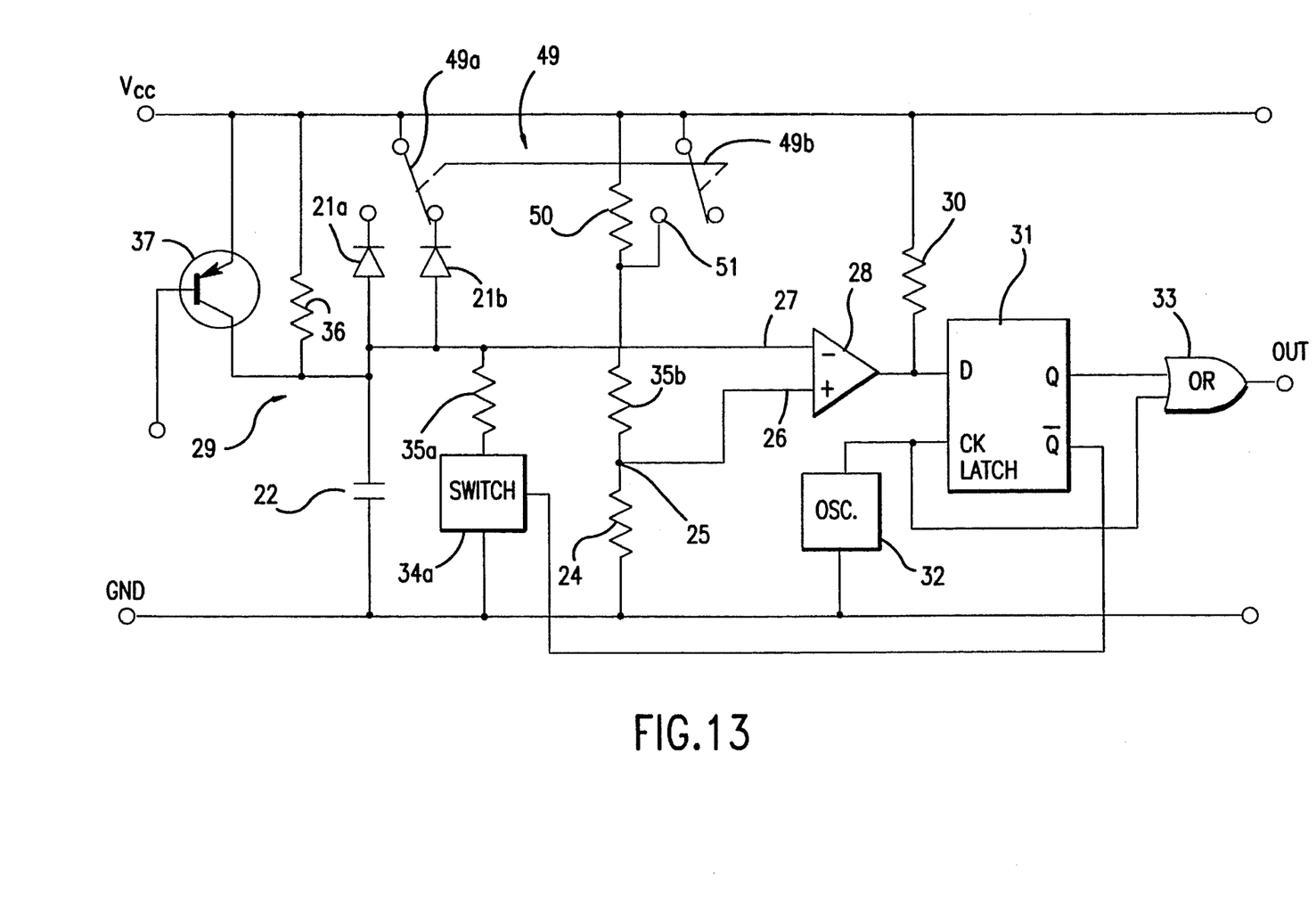
FIG. 13 is a schematic diagram of the fifth preferred embodiment of the photoelectric current converting circuit.

In a fifth preferred embodiment, as shown in FIG. 13, multiple base or reference voltages can be input to the comparator.

With this invention, discharge of the capacitor charged by a photoelectric current is obtained by the discharge loops formed by the switching elements and resistors, rather than by directly using the feedback from operation amplifiers, etc. By making the discharge period much longer than the clock pulse rate of the clock, the voltage of the capacitor remains close to a predetermined voltage and the discharge loops of the switching elements and resistors become equivalent to constant current circuits.

DETAILED DESCRIPTION OF PREFERRED EMBODIMENTS

Figure 1:
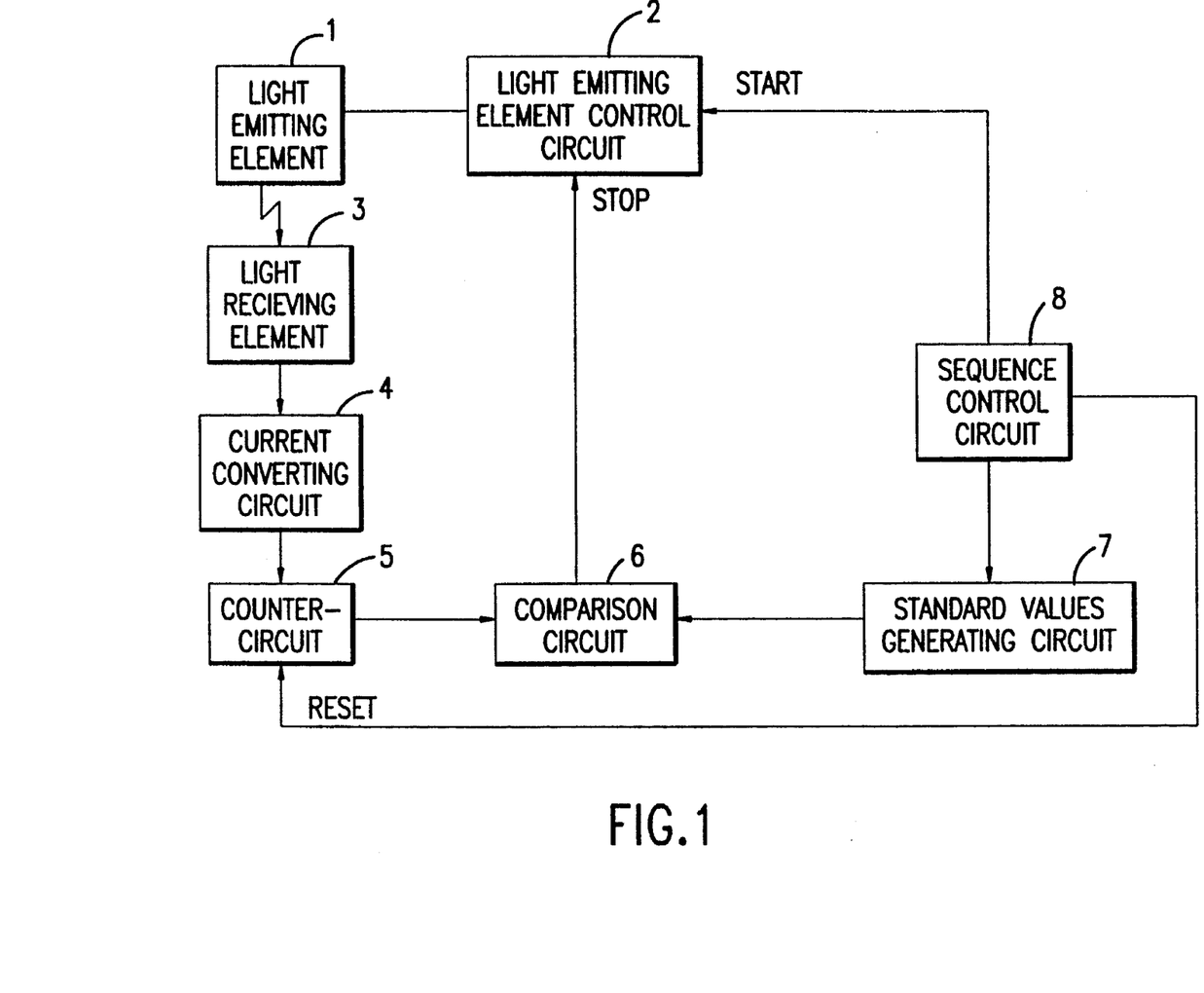
FIG. 1 is a block diagram of the flash device.

FIG. 1 shows a flash device according to this invention. As shown in FIG. 1, a light emitting element 1, such as a xenon flash lamp, is turned on and off by a light emitting element control circuit 2. The light emitting element control circuit 2 comprises a main capacitor, a booster circuit for charging the main capacitor, a trigger circuit turning on the light emitting element 1 and a switching circuit turning off the light emitting element 1. The sequence control circuit 8 outputs a START signal to the light emitting element control circuit 2, which triggers the trigger circuit and thus turns on the light emitting element 1. Once the light emitting element 1 is turned on, a light receiving element 3 converts light received, either directly or indirectly, from the light emitting element 1 into an electric signal.

When automatically adjusting the light output by the light emitting element 1, the light receiving element 3 receives light reflected from the photographic subject and converts the indirectly received light into an electric current. However, when manually adjusting the light output by the light emitting element 1, the light receiving element 3 directly receives the light from the light emitting element 1. In this case, the light receiving element 3 is located within the housing of the light emitting element 1. While the light output by the light emitting element 1 is preset in the manual adjustment process, the light receiving element 1 converts the received light to electric current, as in the automatic adjustment process.

The electric current generated by the light receiving element 3 is output to a current converting circuit 4, which converts the electric current generated by the light receiving element 3 into logic-level voltage pulses. The logic-level voltage pulses from the current converting circuit 4 are counted by a counter circuit 5, to integrate the current generated by the light receiving element 3. The output from the counter circuit 5 is compared with the output from the standard value circuit 7 by the comparison circuit 6. When the value of the counter output from the counter 5 equals or exceeds the value of the output from the standard value circuit 7, the comparison circuit 6 outputs a STOP signal to the light emitting element control circuit 2 to turn off the light emitting element 1. After the light emitting element 1 is turned off, a reset signal from the sequence control circuit 8 resets the light emitting element control circuit 2 and the counter 5 and loads the correct light output value signal from the standard value circuit 7 into the comparison circuit 6.

FIG. 2 shows a first embodiment of the light receiving element 3 and the current converting circuit 4. As shown in FIG. 2, the light receiving element 3 comprises a photodiode 21. The capacitor 22 is charged by the electric current generated by the photodiode 21 upon receiving light from the light emitting element 1. The capacitor 22 and the photodiode 21 are connected in series between a voltage source $V_{cc}$ and ground (earth).

The source voltage $V_{cc}$ is divided by the voltage divider formed from resistors 23 and 24. The base voltage available at the center tap 25 between the resistors 23 and 24 is input to the noninverting input 26 of the operational amplifier forming the comparator 28. The center tap 29 between the capacitor and the photodiode is connected to the inverting input of the comparator 28. When the voltage across the capacitor 22, and thus the voltage at the center tap 29, exceeds the voltage at the center tap 25 of the voltage divider, the output of the comparator 28 becomes a logic-level low voltage signal. The output of the comparator 28 is connected to a pull-up resistor 30 as the comparator 28 has an open collector output. The output of the comparator 28 is also connected to the "D" input of the D-type flip flop 31. The D-type flip flop 31 latches the output from the comparator 28 on the rising edge of the clock signal output by the oscillator 32. The outputs Q and $\overline{Q}$ of the D-type flip flop are, respectively, equivalent to and the inverse of the D input.

As shown in FIG. 2, the Q output of the flip flop 31 is connected to one of the inputs of the OR gate 33. The other input to the OR gate 33 is connected to the output of the oscillator 32. Thus, the OR gate 33 will output a logic-level high voltage signal on either the high portions of the clock cycle or when the Q output from the flip flop 31 is high. The output of the OR gate 33 is connected to the input of the counter 5.

As is also shown in FIG. 2, the $\overline{Q}$ output from the flip flop 31 is connected to the control input of the switching element 34. The switching element 34 connects one end of the resistor 35 to ground. The other end of the resistor 35 is connected to the center tap 29. Thus, when the $\overline{Q}$ output is a logic-level high signal, the switching element 34 connects the center tap 29 through the resistor 35 to ground, thus comprising an electrical discharge path for the capacitor 22.

The switching circuit 34 is active when the logic state of the signal to the control input is high. Thus, the switching circuit 34 connects the resistor 35 to ground only when the signal from the $\overline{Q}$ output of the flip flop 31 is logic high. This of course occurs only when the signal output by the Q output of the flip flop 31 is logic low. This occurs only when the voltage of the center tap 29 exceeds the voltage of the center tap 25. Thus, the switching circuit 34 and resistor 35 cause the capacitor 22 to discharge only when the voltage cross the capacitor 22 exceeds the voltage of the center tap 25. The switching circuit 34 and resistor 35 will continue to discharge the capacitor 22 until the signal from the $\overline{Q}$ output of the flip flop 31 changes to logic low.

Figure 3:
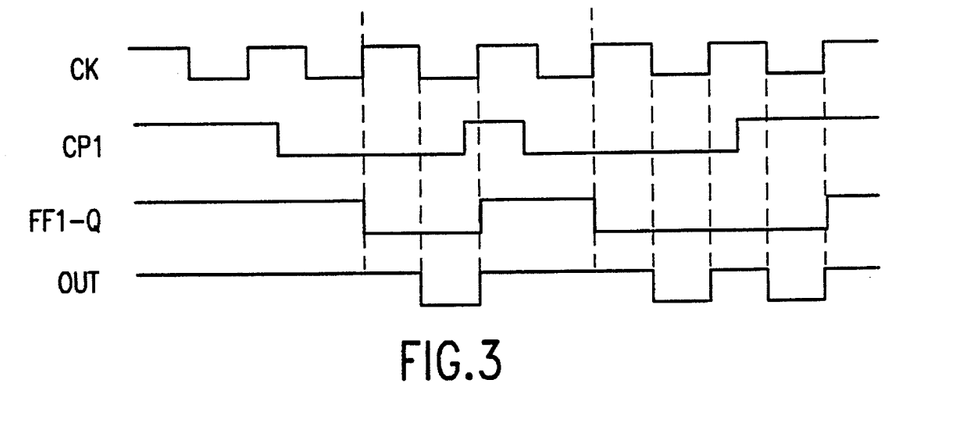
FIG. 3 is a timing diagram of the first preferred embodiment of the photoelectric current converting circuit.

As shown in FIG. 3, this occurs only after the output of the comparator 28 rises to a logic high level and a clock pulse occurs. The output of the comparator 28 will rise to a logic high only after the voltage at the center tap 29 falls below the voltage at the center tap 25. Thus, the switching circuit 34 and resistor 35 will cause the capacitor 22 to discharge no more than one clock pulse after the voltage across the capacitor 22 becomes greater than the voltage at the center tap 25 and will continue to discharge the capacitor 22 until no more than one clock pulse after the voltage across the capacitor 22 falls below the voltage at the center tap 25. Since the voltage across the capacitor is generally very precisely maintained, the value of the discharge current flowing through the resistor 35 when discharging the capacitor 22 boosts the precision of the current converting circuit 4.

It is generally known in the art that operational amplifiers are used to form constant current circuits. In the current converting circuit 4 shown in FIG. 2, a constant current circuit which synchronously switches on or off with the base clock is necessary. However, it is difficult to produce a synchronized constant current when using such analog components as operational amplifiers as they are not critically damped, and switching often causes overshoots and other transients. Such transients and other noise in the constant current generates errors in an analog current converting circuit which adversely affect the ultimately light adjusting characteristics of the flash device. Therefore, in the first preferred embodiment and the preferred embodiments set forth below, the current converting circuit generates the constant current without relying on analog circuitry such as operational amplifiers or the like.

As shown in FIG. 3, the oscillation frequency of the oscillator 32 is much higher than the constant of the RC circuit formed by the capacitor 22 and the resistor 35. The time constant of this RC circuit is set so that the voltage drop across the capacitor 22 for one clock cycle of the oscillator 32 is extremely small. For example, the resistance of the resistor R2 is preferably as high as possible if the switch 34 is an N-channel field effect transistor (FET). The N-channel field effect transistor is preferable for the switching element 34 because it is desirable to minimize the influence in fluctuations of the FET's on resistance. By using a high resistance resistor 35 and thus minimizing the voltage drop across the capacitor for each cycle of the oscillator 32, a higher frequency oscillator 32 can be used. This in turn boosts the resolution of the current converting circuit. At the same time, the maximum value of the resistance of the resistor 35 must be limited, so that the discharge current of the RC circuit formed by the capacitor 22 and the resistor 35 is above the largest current produced by the photodiode 21. This ensures that the voltage across the capacitor 22 is maintained at a level generally around the level of the base voltage.

For example, if the largest photoelectric current produced by the photodiode 21 is one mA, and if the base voltage at the center tap 25 is 3 volts, the total resistance of the series connected resistor 35 and switch 34 is at most 3 k$\Omega$. However, the resistance of the resistor 35 can be set to below 3 k$\Omega$ because the ON resistance of the switch 34 is at most 50$\Omega$. Therefore, even if there is some variation in the ON resistance of the switch 34, the ratio of the resistance variation in the series connected resistor 35 and switch 34 to the overall resistance is very small.

With respect to the capacitance of the capacitor 22, in principle there is no upper limit on its capacitance. However, in practice, if the capacitance of the capacitor 22 is too large, lags appear in the voltage across the capacitor, such that the output of the comparator 28 inverts. This is due to a number of reasons, which include the sensitivity of the comparator 28. At the same time, if the capacitance of the capacitor 22 is too small, discharging the capacitor 22 causes large voltage fluctuations which effect the ability of the circuit to maintain the current at a constant level. Therefore, the capacitance of the capacitor 32 should be set to allow the capacitor 22 to respond to voltage fluctuations when discharging over a single cycle of the oscillator 32. Thus, if the oscillator 32 has a period of 1 µs, the discharge current generated by the 3 k$\Omega$ total resistance between the resistor 35 and the switching element 34 is approximately 1 mA. Thus if the voltage fluctuation across the capacitor 22 per cycle should be no more than 5 mV, the capacitance of the capacitor 22 should be approximately 0.2 mF. In this way, a constant current circuit is easily established.

A resistor 36 connected in parallel to the photodiode 21 between the voltage source Vcc and the center tap 29 is used to precharge the capacitor 22. However, when the power is initially turned on to the current converting circuit 4 shown in FIG. 2 (and the embodiments shown in FIGS. 4, 6, 10, 12 and 13), the capacitor 22 does not charge quickly enough since the resistance of the resistor 36 is extremely high. Therefore, to ensure that the capacitor 22 is charged quickly and thus the current converting circuit 4 has a swift response time, a PNP transistor 37 is connected in parallel with the photodiode 22 and the resistor 36 between the voltage $V_{cc}$ and the center tap 29. The base of the transistor 37 is connected to a microprocessor (not shown) through terminal 38. The transistor 37 is turned on immediately after power is first supplied to the current converting circuit 4, thus bypassing the resistor 36, so that the capacitor 22 charges quickly.

FIG. 3 shows a timing chart for the current converting circuit 4 shown in FIG. 2. Signal CK is the clock signal output by the oscillator 32. Signal CP1 is the output of the comparator 28 and signal FF1-Q is the output of the Q output of the flip flop 31. Finally, signal OUT is the output of the OR gate 33. As shown by the OUT signal, the current converting circuit 4 of FIG. 2 outputs a cyclical pulse even when the capacitor 22 is discharged for two or more cycles because the output signal from the Q output of the flip flop 31 is ORed with the clock circuit CK of the oscillator 32. Thus, as shown in the right hand portion of the timing chart of FIG. 3, even when the output of the comparator 28 is low for two or more cycles of the oscillator 32, such that the signal output from the Q output of the flip flop 31 is low for two or more cycles of the oscillator 32, the signal OUT to the counter 5 cyclically pulses.

As set forth above, the frequency of the oscillator 32 is preferably as high as possible, so that the resolution of the current converting circuit is as high as possible. However, the frequency of the oscillator 32 is limited by the response time of the switch 34. As shown in FIG. 3, in the left hand portion of the timing diagram, the signal FF1-Q is logic low for one cycle of the oscillator 32. Thus, the output from the $\overline{Q}$ output of the flip flop 31 is logic high for one cycle of the oscillator 32.

On the other hand, as shown in the right hand portion of the timing diagram of FIG. 3, the signal FF1-$\overline{Q}$ output from the $\overline{Q}$ output of the flip flop 31 will be logic high for two or more cycles. When the $\overline{Q}$ output is logic high, the switching element 34 is ON. If the switch 34 is not able to form a perfect square wave on the voltage input to the inverting input terminal 27 of the comparator 28, and the frequency of the oscillator 32 is sufficiently large, the slope or lags in the rising edge and falling edge of the square wave cannot be ignored. Since the shapes of the rising and falling edges of the square waves will not necessarily correspond, there may be instances when the voltage drop when the switching element is ON for two or more consecutive cycles will not be a whole number multiple of the one-cycle voltage drop. Because it is highly likely that the switch 34 will be ON for two or more cycles of the oscillator 32 a large percentage of the time, the linear relationship between the discharge time of the capacitor and the number of pulses on the output signal OUT can be lost.

Thus, in a second preferred embodiment of the current converting circuit 4 as shown in FIG. 4, the circuit shown in FIG. 2 is altered to incorporate a second D-type flip flop 40, a second OR gate 41, and a NAND gate 42 and another resistor 43 connected to the center tap 29. The first flip flop 31 and the second OR gate 41 are used to replace the switch 34, while the second flip flop 40, the NAND gate 42, and the resistor 43 form a second discharge loop.

The second OR gate 41 has the same inputs, from the oscillator 32 and the Q output of the flip flop 31, as the first OR gate 33. The output of the second OR gate 41 is connected to the second terminal of the resistor 35 and is used to discharge the capacitor 32. In addition, the output component of the OR gate 41 is an open drain of a field effect transistor, thus providing the same function as the switch 34. Therefore, since the two OR gates 33 and 41 have the same inputs, the discharge loop through the resistor 35 and the OR gate 41 is turned on and off synchronously with the clock signal CK from the oscillator 32 and the pulses output to the counter 5, as shown in FIG. 5.

The D input of the flip flop 40 is connected to the $\overline{Q}$ output of the first flip flop 31. In addition, the flip flop 40 latches on the falling edge, rather than the rising edge, of the clock signal CK. Thus, the flip flop 40 forms a latch whose output latches one-half cycle behind the flip flop 31. Thus, as shown in FIG. 5, the signal FF2-Q output from the Q output of flip flop 40 is one half clock cycle behind and of the opposite polarity as the signal FF1-Q output from the Q output of the first flip flop 31. The Q output of the flip flop 40 and the oscillator 32 are connected to the NAND gate 42. The output of the NAND gate 42 will be logic low only when both the input signals are logic high. This is in contrast to the output of the OR gate 41, which will be logic low only when both of the input signals are logic low. The output component of the NAND gate 42 is an electrolytic-effect transistor having an open drain and is thus able to discharge the capacitor 22 through the resistor 43.

Thus, two independent discharge loops are formed. As shown in FIG. 5, the two separate loops, which discharge the capacitor 22 when the logic levels of the output signals from either the OR gate 41 or the NAND gate 42 are logic low, are each active for one half of a clock cycle of the oscillator 32 and are offset by one half of a clock cycle (a time-sharing format). Thus, even when the capacitor is to be discharged for two or more cycles, the shape of the discharge wave is the same each time because each discharge loop is activated by a one half cycle square wave. Thus, an extremely precise discharge of the capacitor 22 is obtained.

Figure 5:
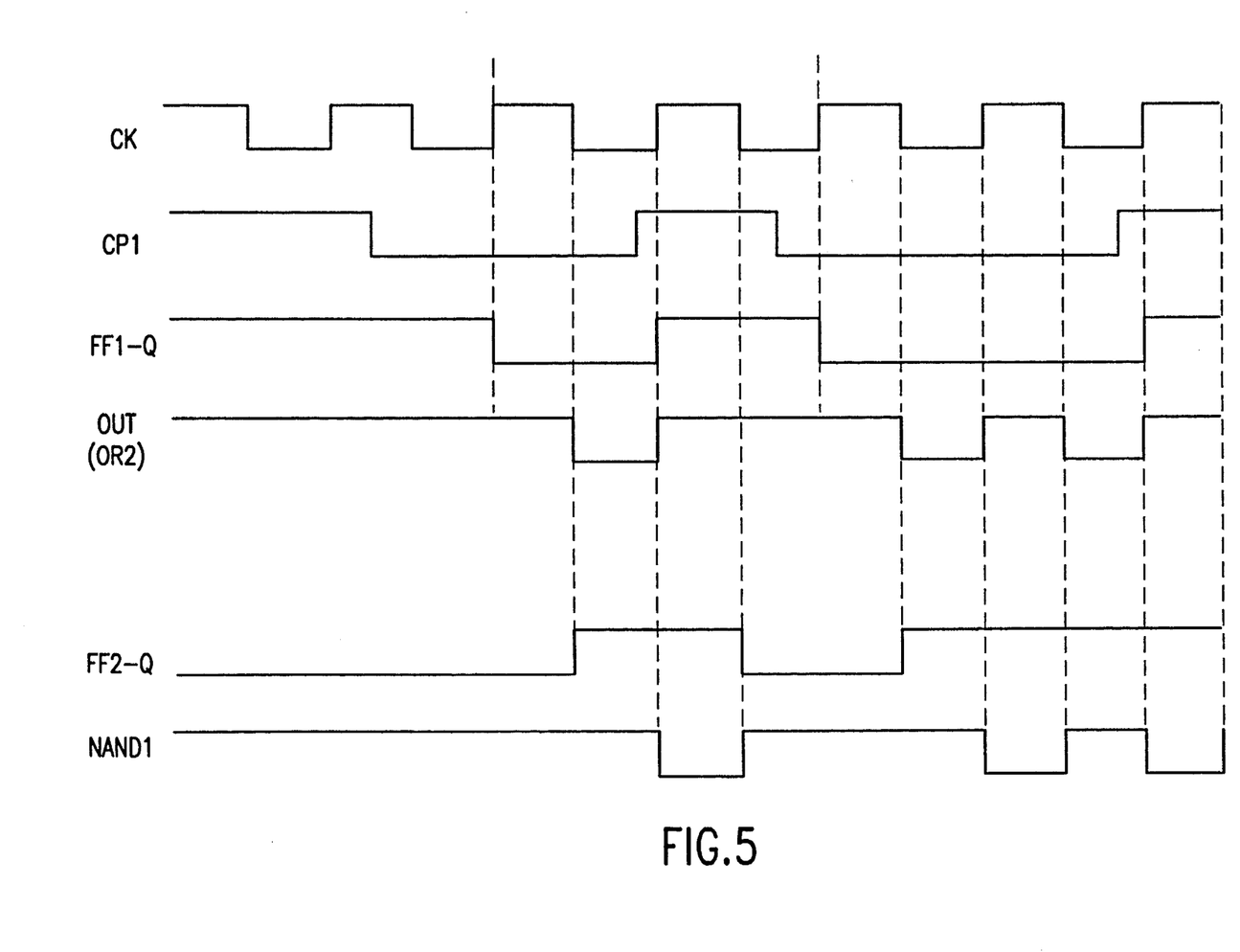
FIG. 5 is a timing diagram of the second preferred embodiment of the photoelectric current converting circuit.
Figure 7:
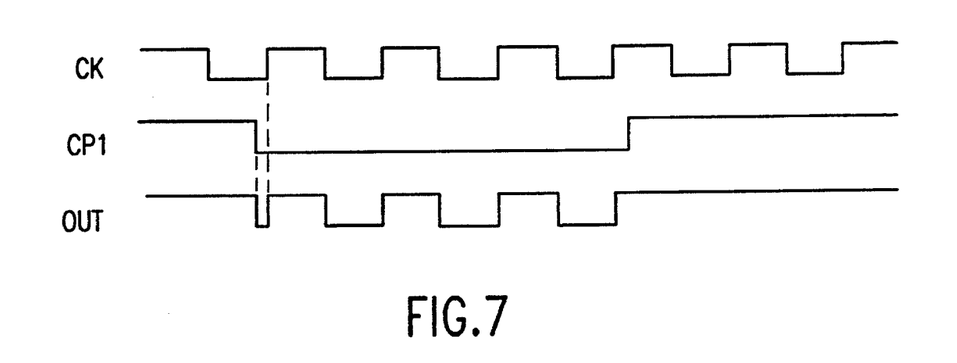
FIG. 7 is a timing diagram of the third preferred embodiment of the photoelectric current converting circuit.

As shown in both FIGS. 3 and 5, in the first and second preferred embodiments, the capacitor 22 is discharged synchronously with the clock signal CK. It is also possible to discharge the capacitor 22 synchronously with the output of the comparator 28, by using a clock pulse existing within the discharge period. This third preferred embodiment is shown in FIG. 6 and its timing chart shown in FIG. 7. The output of the comparator 28 is inverted by an inverter 44. The output of the inverter 44 turns the switch 34 on and off. In addition, rather than using the flip flop 31 as in the first preferred embodiment, the output of the oscillator 32 and the comparator 28 are directly connected to the inputs of the OR gate 33. Thus, as shown in FIG. 7, the output signal OUT from the OR gate 33 pulses immediately upon the output of the comparator 28 going low. The response time of the comparator 28 is very high. If the frequency of the oscillator 32 is also very high, then the current generated by the photodiode 21 can be converted to a pulse train having a very high resolution, as the pulse number can correspond closely to the discharge time.

However, as shown in FIG. 7, since the output of the comparator 28 is not gated or latched on the clock signal CK, as in FIGS. 2–5, a pulse will be output on the output signal OUT which is not a full pulse-width wide, as the output of the comparator 28 and the oscillator 22 are not synchronized.

Accordingly, if the pulse number can be anticipated based on the output period of the comparator, its lack of synchronicity can be compensated for. If the time the comparator 28 outputs a logic low signal is defined as L, in terms of numbers of clock cycles of the oscillator 32, and the integer number of cycles for the period L is defined as INT (L), and the clock signal CK from the oscillator 32 has a 50% duty cycle, then $$L-INT(L)<0.5 \qquad (1)$$

Figure 8:
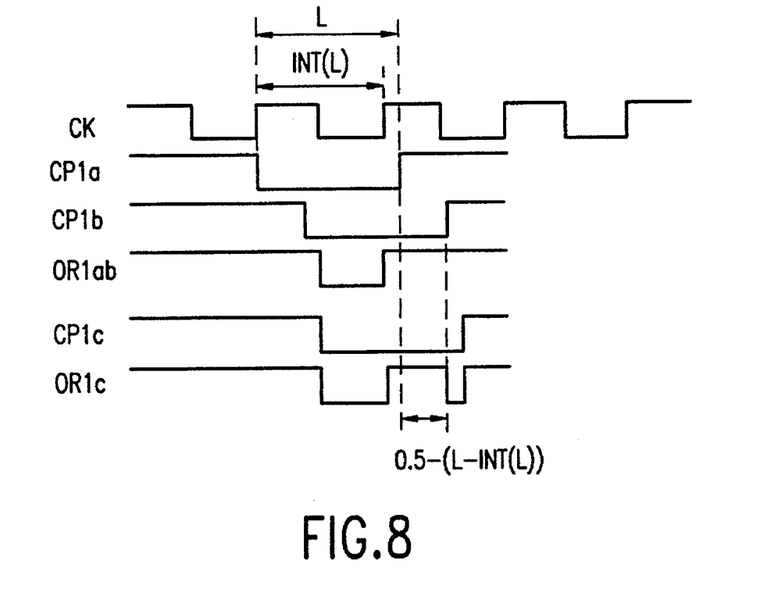
FIG. 8 is an explanatory drawing of the problem points relating to the circuitry of the third preferred embodiment as shown in FIG. 6.

The probability that the above equation will be true is one half. In this case, the number of output pulses on the output signal OUT is either INT(L) or INT(L)+1. This situation is shown in FIG. 8. As shown in FIG. 8, the number of output pulses will be equal to INT(L) when the output of the comparator 28 corresponds to the output of the oscillator 32, as shown in signals CP1a and CP1b. In this case, as shown in the signal OR1ab, a number of pulses equal to INT(L) is output. The probability of this case is:

$$INT(L): 0.5-(L-INT)(L)) \quad (2)$$

In all other cases, the output of the comparator 28, shown in signal CP1c, corresponds to the clock signal CK from the oscillator 32 such that a number of pulses equal to INT(L)+1 are output, as shown in signal OR1c. The probability of this occurring is:

$$INT(L)+1: 0.5-(INT(L)-L) \quad (3)$$

Figure 9:
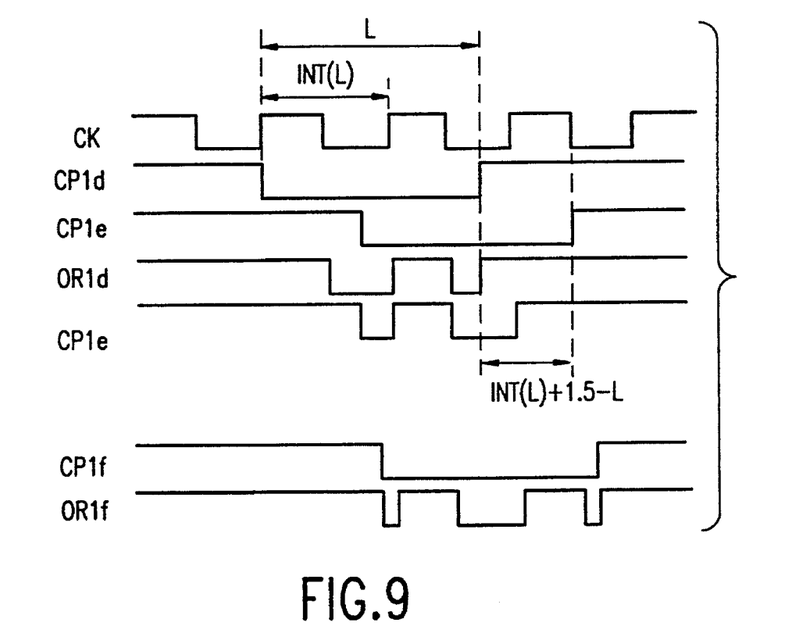
FIG. 9 is another explanatory diagram of the problem points relating to the circuitry of the third preferred embodiment as shown in FIG. 6.

On the other hand, as shown in FIG. 9:

$$L-INT(L) \geq 0.5 \quad (4)$$

The probability of this situation occurring is also one half, and in this case the number of output pulses is equal to either INT(L)+1 or INT(L)+2.

As shown in FIG. 9, when the output from the comparator 28 corresponds to the clock signal output from the oscillator 32 as shown in signals CP1d or CP1e, then INT(L)+1 pulses are output by the OR gate 33, as shown in signals OR1d and OR1e. The probability of this occurring is:

$$INT(L)+1: INT(L)+1.5-L \quad (5)$$

In all other situations, when the signal output by the comparator 28 corresponds to the clock signal output by the oscillator 32 as shown in signal CP1f, INT(L)+2 pulses are output by the OR gate 33, as shown in signal OR1f. The probability of this occurring is:

$$INT(L)+2: L-0.5-INT(L) \quad (6)$$

Therefore, the expected value PC for the number of pulses to be output by the OR gate 33 from a length L signal is the above pulse member and the total sum of the products of the set pulse number and its probability is:

$$\begin{aligned} PC = &\ [INT(L)*(0.5-(L-INT(L)))+ \\ &\ (INT(L)+1)*(0.5-(INT(L)-L))+ \\ &\ (INT(L)+1)*(INT(L)+1.5-L)+ \\ &\ (INT(L)+2)*(L-0.5-INT(L))]/2 \\ = &\ L+0.5 \end{aligned} \quad (7)$$

That is, in the current converting circuit shown in FIG. 6, the number of pulses output by the OR gate 33 for each pulse train is an average 0.5 pulse too many. Since the error rate is only ½ of a pulse for each pulse train, regardless of the number of pulses in each pulse train, the error introduced by this excess pulse can be minimized by ensuring that each pulse train contains a large number of pulses. This reduces the ratio of excess pulses to real pulses, and is obtained by ensuring the frequency of the oscillator 32 is very high.

However, strictly speaking, such a measure is insufficient, and the circuit shown in FIG. 6 must be modified. A fourth preferred embodiment is shown in FIG. 10, which is the modification necessary to the third preferred embodiment shown in FIG. 6. As shown in FIG. 10, the fourth preferred embodiment of the circuit has been designed in order to mask one output pulse at the rate of once per two output pulse trains from the OR gate 48. That is, one output pulse will be masked every second time the output signal CP1 from the comparator 28 becomes logic low, as shown in the timing diagram of FIG. 11.

As shown in the circuit of FIG. 10, the D-type flip flop 45 divides the frequency of the output pulse train of signal CP1 output by the comparator 28 by two, as shown by signal FF3-Q. The output signal from the Q output of the flip flop 45 and the output signal from the comparator 28 are connected to the AND gate 46. The output from the AND gate 46 is connected to the preset input PR of the flip flop 47. Thus, when the output of the AND gate 46 is logic high, the state of the flip flop 47 is preset and the state of the output signal FF4-Q from the Q output of the flip flop 47 is fixed at logic high. The output Q from the flip flop 47 and the output from the OR gate 33 are connected to the OR gate 48. The output of the OR gate 48 is connected to the counter circuit 5.

Figure 11:
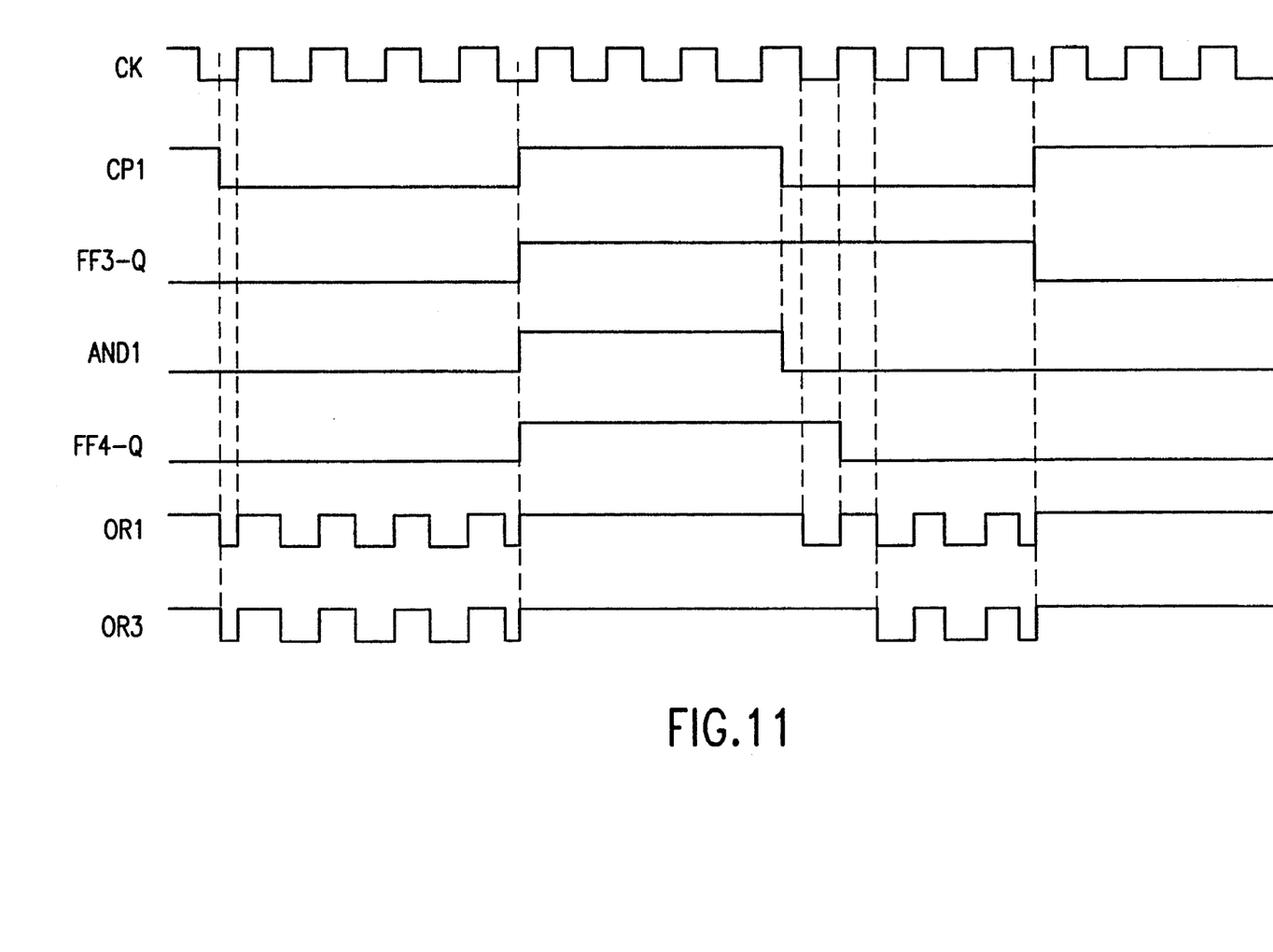
FIG. 11 is a timing diagram of the variation of the third preferred embodiment of the photoelectric current converting circuit.

Since the output state of the output signal FF4-Q from the Q output of flip flop 47 is held high when the AND gate output is high, the OR gate 48 masks the output of the OR gate 33. When the output of the comparator 28 goes low, the output of the AND gate 46 goes low. At the first rising edge of the clock signal CK from the oscillator 32 after the preset signal PR (i.e., signal AND1) goes logic low, the state of the output Q of the flip flop 47 goes logic low, as the input D is connected to ground. Thus, the output from the OR gate 48 is unmasked one clock cycle after the output signal CP1 from the comparator 28 goes low. Finally, as shown in FIG. 11, the state of the FF3-Q signal output from the Q output of the flip flop 45 switches its state every rising edge of the CP1 signal from the comparator 28. Thus, a pulse is deleted from the OR3 signal output by the OR gate 48 only every other time the CP1 signal from the comparator 28 goes low. Thus, the output OR3 from the OR gate 48 correctly corresponds to the number of clock pulses generated when the CP1 signal from the comparator 28 is low, since an average of ½ pulse is eliminated from each pulse train of the OR3 signal. Thus, the OR3 signal from the OR gate 48 correctly indicates the amount of light received by the photodetector 21.

It should also be appreciated that the electric flash device includes an exterior automatic light adjusting function and a manual light adjusting function which allow one half or one fourth, respectively, of the amount of light as in a full luminescence mode. Each light adjusting mode has a different light receiving element 3. The light receiving element 3 used with the manual light adjusting mode is in the vicinity of the light emitting element 1 and directly receives the light emitted by the light emitting element 1. On the other hand, the light receiving element 3 used with the external automatic light adjusting mode is located on a front face of the electronic flash device, so that it picks up light reflected from the photographic subject. Therefore, the light receiving element 3 used with the manual light adjusting mode receives a much stronger light signal than the light receiving element 3 used with the automatic light adjusting mode. Therefore, it is likely that a current converting circuit 4 which is designed for one mode is not properly adjusted for the other mode.

That is, in the embodiments set forth above, the current converting circuit 4 is designed to be used with a predetermined range of photoelectric currents, which may not correspond to the photoelectric currents being generated in the other mode. Thus, the resolution may be incorrect in an apparatus designed to be used with the manual light adjusting mode when using the external automatic light adjusting mode or vice versa.

To compensate for this source of error, a fourth preferred embodiment of the invention, as shown in FIG. 12, provides additional elements for switching between two different photodiodes and two different discharge circuit loops. In the circuit shown in FIG. 12, which is generally identical to the first preferred embodiment shown in FIG. 2, the $\overline{Q}$ output of the flip flop 31 is input to the output of a switch element 49b of a switch 49. The switch 49 has a pair of switch elements 49a and 49b. In addition, the single photodiode 21 of FIG. 2 is split into two photodiodes 21a and 21b. Likewise, the resistance path formed by resistor 35 and switch 34 in FIG. 2 is split into two paths. The first resistance path comprises resistor 35a and switch 34a, while the second resistance path comprises resistor 35b and switch 34b.

The input of the first switch element 49a is connected to the power source $V_{cc}$, while the output of the first switch element 49a can be switched between the photodiodes 21a and 21b. Simultaneously, the input to the second switch 49b is connected to the $\overline{Q}$ output of flip-flop 31, while the output of the second switch element 49b can be switched between the control inputs of switch elements 34a and 34b. The switch 49 is externally operated, either by the camera operator or by a microprocessor to switch element 49a between the photodiode 21a used with the manual light adjusting mode and the photodiode 21b used with the external automatic light adjusting mode. Simultaneously, when the first switch element 49a selects the photodiode 21a, the second switch element 49b selects the first resistance path comprising resistor 35a and switch element 34a. Similarly, if the first switch element 49a selects the photodiode 21b, the second switch element 49b selects the second resistance path comprising resistor 35b and switch element 34b. In this way, the current converting circuit shown in FIG. 12 can be adjusted to properly work with the range of current output from either photodiode 21a or 21b.

A fifth preferred embodiment of the present invention is shown in FIG. 13. The first preferred embodiment as shown in FIG. 2 is again adjusted using the switch 49. However, in the fifth preferred embodiment shown in FIG. 13, while the first switch element 49a switches between a first photodiode 21 and a second photodiode 21b, the second switch element 49b selectively connects the power supply voltage $V_{cc}$ directly to the resistor 23 through terminal 51 or inserts the resistor 50 into the series path comprising resistors 23 and 24. In this way, the average current output by the photodiode can be changed. In addition, the base voltage at the center tap 25, and thus the reference voltage on the non-inverting input 26 of the comparator 28 can be changed. When the switch 49 is in the left-hand position, the circuit shown in FIG. 3 is identical to the circuit shown in FIG. 2. However, when the switch 49 is in the right-hand position, the current output from the photodiode to the capacitor 28 is changed. This changes the charging/detecting time of the capacitor 22 and the on and off voltage point of the comparator 28. This ultimately changes the number of output pulses in the output pulse train output from the OR gate 33 or alternately ensures the number of pulses is kept constant regardless of the adjustment mode being used.

Finally, the base voltage supplied to the comparator can also be determined by using a digital to analog D/A function using a known data converter. Such a D/A converter can include a one chip microprocessor. Thus, the base voltage can be generated by any known means and is not limited to using a voltage divider, as shown in FIGS. 2, 4, 6, 10, 12 and 13. Similarly, the logic functions formed by the logic circuits shown in FIGS. 2, 4, 6, 10, 12 and 13 are not limited to the particular logic elements shown, but can be formed by any combination of logic gates and inputs which generate equivalent logic functions. For example, in FIG. 10, the D input of latch 47 can be connected to $V_{cc}$, and the second OR gate 48 can be connected to the $\overline{Q}$ output, in order to generate the same logic function as the circuit shown in FIG. 10. Thus, any circuit containing elements providing equivalent logic functions are within the contemplated scope of the claimed invention.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A current converting circuit converting a current from a current source to a voltage pulse train and comprising:

a capacitor connected to the current source and storing a voltage charge;

a voltage supply circuit supplying a reference voltage;

a comparator comparing the stored voltage with the reference voltage;

an outputting circuit selectively outputting the voltage pulse train based on an output of the comparator;

a discharging circuit selectively discharging the capacitor based on the output of the comparator; and a plurality of current sources and a selecting member to select one of the plurality of current sources, wherein the discharging circuit has a plurality of discharging loops and one of the discharging loops is selected in response to the selecting member.

2. The current converting circuit of claim 1, wherein when the stored voltage is greater than the reference voltage, the output of the comparator circuit is a first level and when the stored voltage is less than the reference voltage, the output of the comparator circuit is a second level.

3. The current converting circuit of claim 1, wherein the outputting circuit comprises:

a clock pulse generator generating a clock pulse;

a first latch circuit latching the output of the comparator based on the clock pulse; and a logic gate, an output of the first latch circuit and an output of the clock pulse generator connected to inputs of the logic gate, the logic gate outputting the clock pulses when the output of the first latch circuit is the first level.

4. The current converting circuit of claim 1, wherein the discharging circuit comprises:

a latch circuit;

a switch circuit; and a resistor; wherein:

a first terminal of the resistor is connected to the capacitor, a second terminal of the resistor is connected to a first terminal of the switch circuit, a second terminal of the switch circuit is connected to earth, and a control terminal of the switch circuit is connected to an output of the latch circuit.

5. The current converting circuit of claim 1, wherein the discharging circuit has a switching circuit, said switching circuit becoming conductive based on the output of the comparator.

6. The current converting circuit of claim 2, wherein the discharging circuit generates a plurality of discharging signals when the output of the comparator circuit is the first level, and wherein each of the discharging signals is generated for a same width of a period.

7. The current converting circuit of claim 6, wherein each of the discharging signals has a common wave form.

8. The current converting circuit of claim 6, wherein the discharging circuit generates the plurality of discharging signals in a time-sharing format.

9. The current converting circuit of claim 1, wherein the discharging circuit has a plurality of discharging loops.

10. The current converting circuit of claim 9, wherein the discharging circuit causes each of the discharging loops to actuate for a different period.

11. The current converting circuit of claim 1, further comprising a dividing circuit to divide the frequency of the output of the comparator, wherein the outputting circuit comprises a first gate circuit, a second gate circuit and a clock pulse generator, wherein an input of the first gate circuit is connected to the output of the comparator and to the output of the clock pulse generator, and wherein the second gate circuit masks the output of the first gate circuit based on the output of the dividing circuit.

12. A current converting circuit converting a current from a current source to a voltage pulse train and comprising:
   a capacitor connected to the current source and storing a voltage charge;
   a voltage supply circuit supplying a reference voltage;
   a comparator comparing the stored voltage with the reference voltage;
   an outputting circuit selectively outputting the voltage pulse train based on an output of the comparator;
   a discharging circuit selectively discharging the capacitor based on the output of the comparator; and
   a plurality of current sources and a selecting member to select one of the plurality of current sources, wherein the voltage supply circuit supplies a plurality of reference voltages, and one of the reference voltages is selected in response to the selecting member.

13. A current converting circuit for converting a current from a current source to a voltage pulse train, comprising:
   current storing means for storing the current and outputting a voltage signal;
   reference voltage generating means for generating a reference voltage;
   comparing means for comparing the voltage signal with the reference voltage, and outputting a comparison signal;
   discharge means for discharging the current storage means based on the output signal; and
   pulse train generating means for generating and outputting the voltage pulse train based on the comparison signal, the pulse train generating circuit comprising clock means for generating clock pulses and logic means for logically combining the clock pulses and the comparison signal, wherein the logic means comprises:
   a first gate means for logically combining the comparison signal and the clock signal and outputting a first gate signal;
   frequency divider means for reducing a pulse frequency of the comparison signal and outputting a divider signal;
   second gate means for logically combining the comparison signal and the divider signal and outputting a second gate signal;
   delay means for generating a delayed signal based on the second gate signal and the clock signal; and
   third gate means for logically combining the first gate signal and the delayed signal.

14. The current converting circuit of claim 13, wherein when the comparison signal indicates the reference voltage is less than the voltage signal, the discharge means discharges the current storage means and the pulse train generating means outputs the voltage pulse train.

15. The current converting circuit of claim 13, wherein the current storage means comprises a capacitor serially connected between the current source and earth.

16. The current converting circuit of claim 13, wherein the discharge means comprises:
   at least one discharge circuit; and
   control means for controlling the at least one switch means;
   wherein each discharge circuit comprises:
      a resistor, and
      switch means for selectively connecting the resistor to earth.

17. The current converting circuit of claim 13, wherein the current source comprise a photodiode.

18. The current converting circuit of claim 13, wherein the current source comprises:
   a plurality of photodiodes; and
   switch means for selectively connecting one of the plurality of photodiodes to the capacitor.

19. The current converting circuit of claim 13, wherein the reference voltage generating means comprises a plurality of serially connected resistors.

20. A camera system comprising:
   a light receiving element to convert light incident thereon to a current;
   a capacitor electrically connected to the light receiving element to store a voltage charge;
   a reference voltage supply circuit;
   a comparator electrically connected to the capacitor and to the reference voltage supply circuit to compare the stored voltage with a reference voltage supplied from the reference voltage supply circuit;
   a pulse generating circuit electrically connected to the comparator to generate pulses corresponding to the comparator;
   a discharging circuit electrically connected to the comparator to discharge the capacitor based on the output of the comparator; and
   another light receiving element and a mode selecting member to be operated to select one of a plurality of light receiving modes, and wherein the discharging circuit has a plurality of discharging loops corresponding to the plurality of the light receiving modes.

21. A camera system comprising:
   a light receiving element to convert light incident thereon to a current;
   a capacitor electrically connected to the light receiving element to store a voltage charge;
   a reference voltage supply circuit;
   a comparator electrically connected to the capacitor and to the reference voltage supply circuit to compare the stored voltage with a reference voltage supplied from the reference voltage supply circuit;
   a pulse generating circuit electrically connected to the comparator to generate pulses corresponding to the comparator;
   a discharging circuit electrically connected to the comparator to discharge the capacitor based on the output of the comparator; and another light receiving element and a mode selecting member to be operated to select one of a plurality of light receiving modes, and wherein the reference voltage supply circuit supplies a plurality of reference voltages corresponding to a plurality of the light receiving modes.

* * * * *